US 12,364,089 B2

(12) United States Patent
Khademhosseini et al.

(10) Patent No.: US 12,364,089 B2
(45) Date of Patent: Jul. 15, 2025

(54) PRESSURE SENSOR DEVICE WITH ORGANIC ELECTROCHEMICAL TRANSISTORS WITH MICROSTRUCTURED HYDROGEL GATING MEDIUM

(71) Applicant: THE REGENTS OF THE UNIVERSITY OF CALIFORNIA, Oakland, CA (US)

(72) Inventors: Alireza Khademhosseini, Los Angeles, CA (US); Shiming Zhang, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 182 days.

(21) Appl. No.: 18/042,197

(22) PCT Filed: Aug. 25, 2021

(86) PCT No.: PCT/US2021/047612
§ 371 (c)(1),
(2) Date: Feb. 17, 2023

(87) PCT Pub. No.: WO2022/051152
PCT Pub. Date: Mar. 10, 2022

(65) Prior Publication Data
US 2024/0049483 A1    Feb. 8, 2024

Related U.S. Application Data
(60) Provisional application No. 63/074,335, filed on Sep. 3, 2020.

(51) Int. Cl.
*G01L 1/00*    (2006.01)
*H10K 10/46*    (2023.01)

(52) U.S. Cl.
CPC ............ *H10K 10/471* (2023.02); *G01L 1/005* (2013.01)

(58) Field of Classification Search
CPC .................. G01L 1/146; G01L 1/14
See application file for complete search history.

(56) References Cited

U.S. PATENT DOCUMENTS 8,569,809 B2 * 10/2013 Thomas .................. G01L 1/146
257/253
9,112,058 B2 * 8/2015 Bao ........................ G06F 3/0445
(Continued)

FOREIGN PATENT DOCUMENTS

EP     2251663 A2 * 11/2010 ........... G01L 9/0098
WO    WO-2015028700 A1 * 3/2015 ......... H01L 51/0558
(Continued)

OTHER PUBLICATIONS

PCT International Search Report for PCT/US2021/047612, Applicant: The Regents of the University of California, Form PCT/ISA/210 and 220, dated Dec. 7, 2021 (4 pages).
(Continued)

*Primary Examiner* — Tran M. Tran
(74) *Attorney, Agent, or Firm* — VISTA IP LAW GROUP LLP

(57) ABSTRACT

A low power-consumption iontronic pressure sensor is disclosed that is based on OECT where an ionic hydrogel is used as solid gating medium for pressure sensing transistor elements formed thereon. The pressure sensor includes a substrate containing one or more pressure sensing transistor elements with each transistor element including a source electrode, a drain electrode, and a channel formed from a material comprising an electrically conducting polymer. A microstructured solid gel electrolyte having a plurality of microstructures formed thereon serves as the gating medium and is disposed atop the channel. A gate electrode is dis-
(Continued)

posed on the microstructured solid gel electrolyte. The resultant iontronic pressure sensor may be operated at voltages less than 1 V, with a power-consumption between ~$10^1$-$10^3$ µW, while maintaining a tunable sensitivity between 1~10 $kPa^{-1}$.

19 Claims, 9 Drawing Sheets

(56) References Cited

U.S. PATENT DOCUMENTS

| | | | |
|---|---|---|---|
| 9,281,415 B2* | 3/2016 | Bao | G06F 3/0445 |
| 9,472,673 B2* | 10/2016 | Murata | H10K 71/236 |
| 9,677,952 B2* | 6/2017 | Bao | G01L 1/148 |
| 10,001,862 B2* | 6/2018 | Xu | G01K 7/186 |
| 10,078,027 B2* | 9/2018 | Masuda | G01L 9/0073 |
| 10,126,191 B2* | 11/2018 | Li | G01L 9/0044 |
| 10,194,856 B2* | 2/2019 | Afentakis | A61B 5/6892 |
| 10,274,455 B2* | 4/2019 | Ram | G01N 27/4146 |
| 10,282,581 B2* | 5/2019 | Park | G01L 1/146 |
| 10,401,241 B2* | 9/2019 | Madden | G06F 3/04144 |
| 10,424,751 B2* | 9/2019 | Doris | H10K 19/10 |
| 10,497,866 B1* | 12/2019 | Fuller | H10B 63/24 |
| 10,545,058 B2* | 1/2020 | Bao | H01L 29/84 |
| 10,663,358 B2* | 5/2020 | Madden | G01L 11/00 |
| 10,718,676 B2* | 7/2020 | Chen | H10N 70/826 |
| 10,741,778 B2* | 8/2020 | Kirsch | G11C 13/0016 |
| 10,908,037 B2* | 2/2021 | Li | G01L 1/18 |
| 11,426,450 B2 | 8/2022 | Khademhosseini et al. | |
| 11,605,508 B2* | 3/2023 | Noshadi | H01G 11/62 |
| 11,667,128 B2* | 6/2023 | Martin | B41J 2/14072 347/12 |
| 11,946,821 B2* | 4/2024 | Bao | G01L 1/146 |
| 11,965,850 B2* | 4/2024 | Haick | G01N 27/125 |
| 12,013,295 B2* | 6/2024 | Kim | C08K 3/36 |
| 12,078,557 B2* | 9/2024 | Tanaka | G01L 1/205 |
| 12,188,894 B2* | 1/2025 | Lefler | G01N 27/4145 |
| 2006/0237080 A1 | 10/2006 | Jon et al. | |
| 2008/0009002 A1* | 1/2008 | Gruner | G01N 33/5438 435/6.19 |
| 2008/0193536 A1 | 8/2008 | Khademhosseini et al. | |
| 2012/0062245 A1* | 3/2012 | Bao | G06F 3/0445 324/661 |
| 2014/0264577 A1 | 9/2014 | Rieger et al. | |
| 2016/0211330 A1 | 7/2016 | Li et al. | |
| 2017/0179530 A1 | 6/2017 | Gering et al. | |
| 2018/0038745 A1 | 2/2018 | Madden et al. | |
| 2018/0110901 A1 | 4/2018 | Lewis et al. | |
| 2019/0026519 A1 | 1/2019 | Park et al. | |
| 2019/0131555 A1 | 5/2019 | Doris et al. | |
| 2019/0173096 A1 | 6/2019 | Liu et al. | |
| 2020/0129435 A1 | 4/2020 | Akbari et al. | |
| 2022/0080376 A1 | 3/2022 | Sheikhi et al. | |
| 2022/0280111 A1* | 9/2022 | Sonkusale | A61B 5/01 |
| 2025/0027827 A1* | 1/2025 | Sonkusale | H10K 10/484 |
| 2025/0044173 A1* | 2/2025 | Fang | G01L 9/008 |

FOREIGN PATENT DOCUMENTS

| | | |
|---|---|---|
| WO | WO 2020/146031 | 7/2020 |
| WO | WO 2021/142160 | 7/2021 |
| WO | WO 2022/040177 | 2/2022 |
| WO | WO 2022/093866 | 5/2022 |

OTHER PUBLICATIONS

PCT Written Opinion of the International Search Authority for PCT/US2021/047612, Applicant: The Regents of the University of California, Form PCT/ISA/237, dated Dec. 7, 2021 (13 pages).
Yuanyuan Bai et al., Transparent hydrogel with enhanced water retention capacity by introducing highly hydratable salt, Applied Physics Letters, 105, 151903 (2014).
Jacob T. Friedlein et al., Influence of disorder on transfer characteristics of organic electrochemical transistors, Appl. Phys. Lett. 111, 023301 (2017); doi: 10.1063/1.4993776.
Wei Gao et al., Fully integrated wearable sensor arrays for multiplexed in situ perspiration analysis, Nature. Jan. 28, 2016; 529(7587): 509-514. doi:10.1038/nature16521.
Mahdi Ghazal et al., Addressing Organic Electrochemical Transistors for Neurosensing and Neuromorphic Sensing, IEEE Sensors 2019, Oct. 2019, Montreal, Canada. 10.1109/SENSORS43011.2019. 8956648.
Dion Khodagholy et al., High transconductance organic electrochemical transistors, Nature Communications, 4:2133, DOI: 10.1038/ncomms3133, www.nature.com/naturecommunications.
S.C.B. Mannsfeld et al., Highly Sensitive Flexible Pressure Sensors with Micro-structured Rubber Dielectric Layers, Nature Materials, 9, 859-864 (2010).
Sung Hwan Kim et al., Flexible, Stretchable and Implantable PDMS Encapsulated Cable for Implantable Medical Device, Biomed Eng Lett (2011) 1:199-203, DOI 10.1007/s13534-011-0033-8.
Anna-Maria Pappa et al., Organic Transistor Arrays Integrated with Finger-Powered Microfluidics for Multianalyte Saliva Testing, Adv. Healthcare Mater. (2016), DOI: 10.1002/adhm.201600494.
Jonathan Rivnay et al., High-performance transistors for bioelectronics through tuning of channel thickness, Sci. Adv. (2015) 1:e1400251 (6 pages).
Gregor Schwartz et al., Flexible polymer transistors with high pressure sensitivity for application in electronic skin and health monitoring, Nature Communications (2012), 4:1859, DOI:10.1038/ncomms2832, www.nature.com/naturecommunications.
Wujin Sun et al., Engineering Precision Medicine, Adv. Sci., (2019), 6, 1801039 (19 pages).
Takao Someya et al., A large-area, flexible pressure sensor matrix with organic field-effect transistors for artificial skin applications, PNAS, Jul. 6, 2004, vol. 101, No. 27, 9966-9970.
Takao Someya et al., Conformable, flexible, large-area networks of pressure and thermal sensors with organic transistor active matrixes, PNAS, Aug. 30, 2005, vol. 102, No. 35, 12321-12325.
Kuniharu Takei et al., Nanowire active-matrix circuitry for low-voltage macroscale artificial skin, Nature Materials, (Oct. 2010), vol. 9, 821-826, www.nature.com/naturematerials.
Giuseppe Tarabella et al., Effect of the gate electrode on the response of organic electrochemical transistors, Appl. Phys. Lett. 97, 123304 (2010), doi: 10.1063/1.3491216.
Zhongwu Wang et al., The Semiconductor/Conductor Interface Piezoresistive Effect in an Organic Transistor for Highly Sensitive Pressure Sensors, Adv. Mater. (2018), 1805630 (10 pages).
Shiming Zhang et al., Hydrogel-Enabled Transfer-Printing of Conducting Polymer Films for Soft Organic Bioelectronics, Adv. Funct. Mater. (2019), 1906016 (8 pages).
Shiming Zhang et al., Tuning the Electromechanical Properties of PEDOT:PSS Tuning the Electromechanical Properties of PEDOT:PSS, Adv. Electron. Mater. (2019), 5, 1900191 (7 pages).
Qiaoming Zhang et al., A solid state aqueous electrolyte-gated field-effect transistor as a low-voltage operation pressure sensitive platform, Adv. Mater. (2019), (20 pages).
Shiming Zhang et al., Room-temperature Formed PEDOT:PSS Hydrogels Enable Injectable, Soft, and Healable Organic Bioelectronics, Adv Mater., (Jan. 2020), 32(1): e1904752. doi:10.1002/adma. 201904752.
Shiming Zhang et al., Water stability and orthogonal patterning of flexible micro-electrochemical transistors on plastic, Journal of Materials Chemistry C, (Jan. 2016) (5 pages).
Shiming Zhang et al., Flexible self-powered biosensors, Nature, (Sep. 27, 2018), vol. 561, 466-467.
Jonathan Rivnay et al., Organic electrochemical transistors, Nature Reviews Materials, vol. 3, No. 2, pp. 1-14 (2018).
Shiming Zhang et al., Patterning of Stretchable Organic Electrochemical Transistors, Chem. Mater. (2017), 29, 3126-3132.
Ziyang Liu et al., Polyelectrolyte Dielectrics for Flexible Low-Voltage Organic Thin-Film Transistors in Highly Sensitive Pressure Sensing, Adv. Funct. Mater. 2019, 29, 1806092 (11 pages).
PCT International Preliminary Report on Patentability (Chapter I of the Patent Cooperation Treaty) for PCT/US2021/047612, Appli-

(56) References Cited

OTHER PUBLICATIONS cant: The Regents of the University of California, Form PCT/IB/326 and 373, dated Mar. 16, 2023 (15 pages).

* cited by examiner

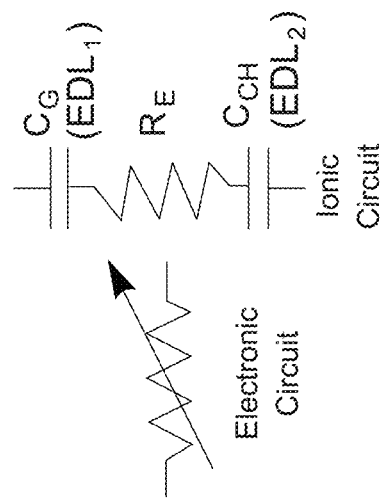
FIG. 1A
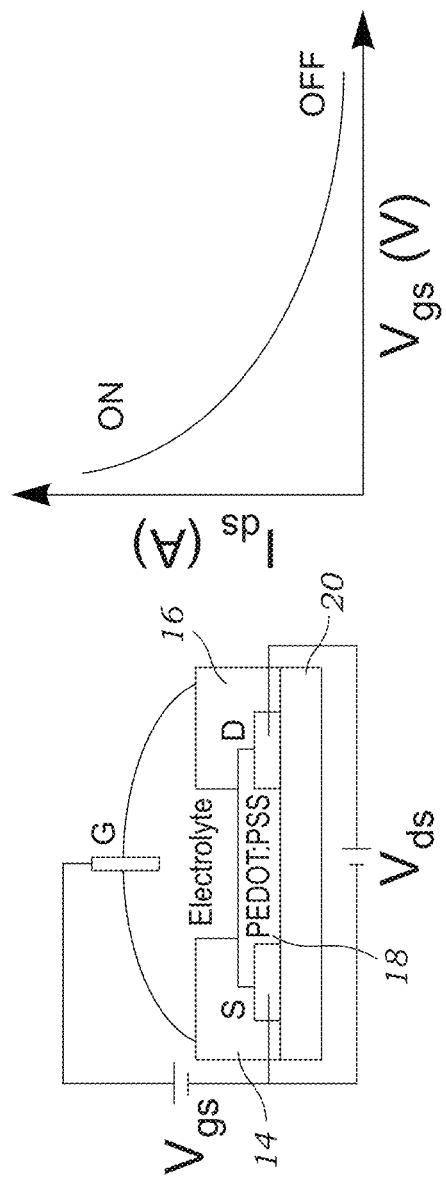
FIG. 1B
FIG. 1C
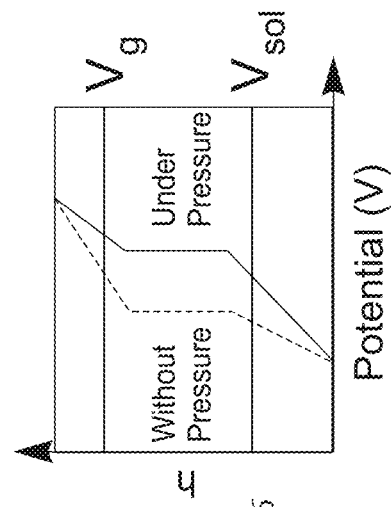
FIG. 1D
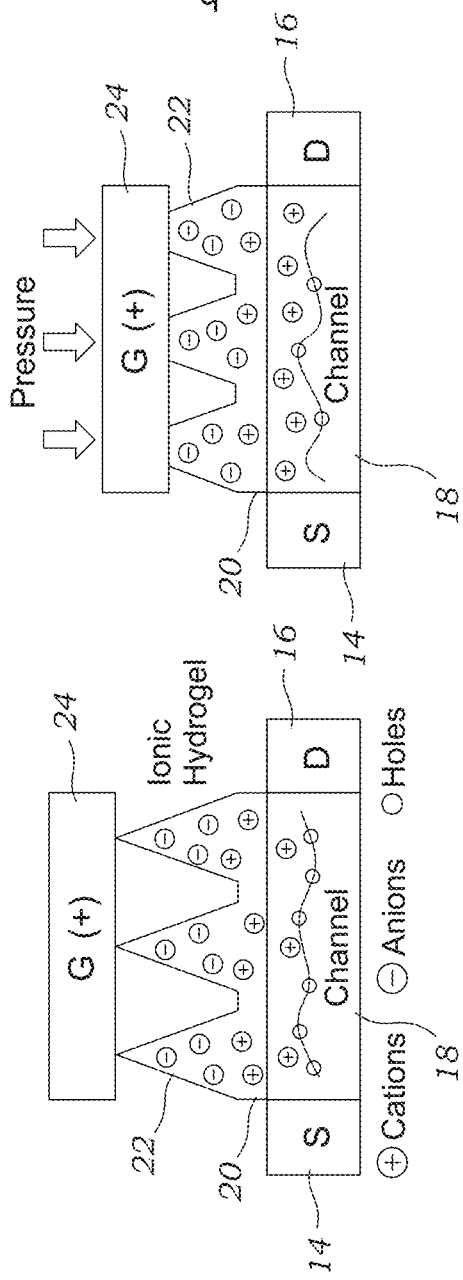
FIG. 1E
FIG. 1F

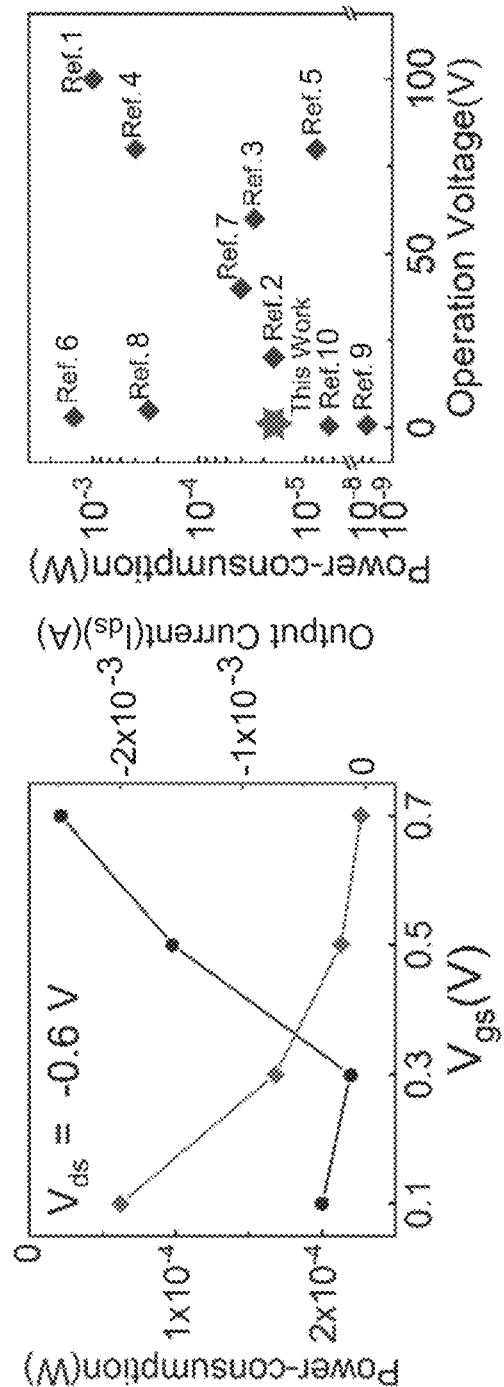
FIG. 5A
FIG. 5B
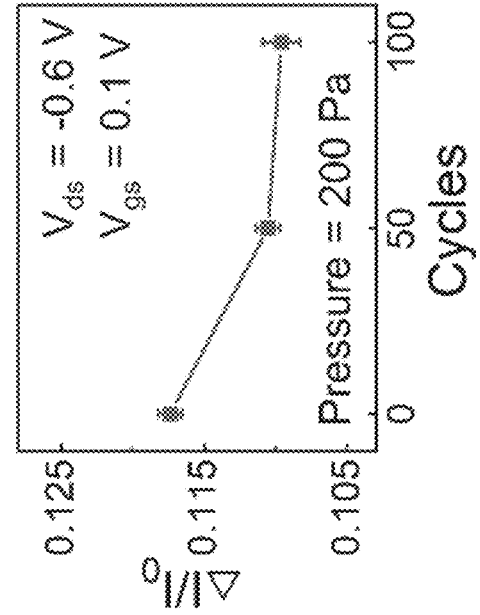
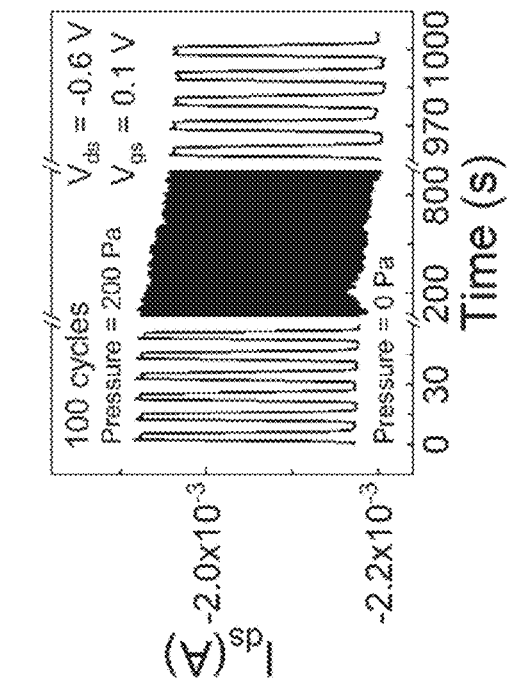
FIG. 5C
FIG. 5D

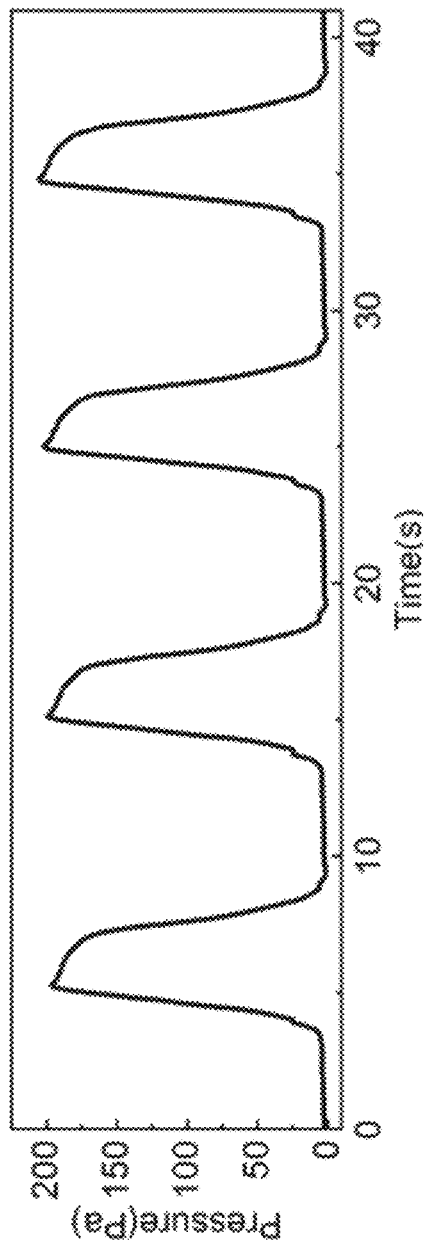
FIG. 8
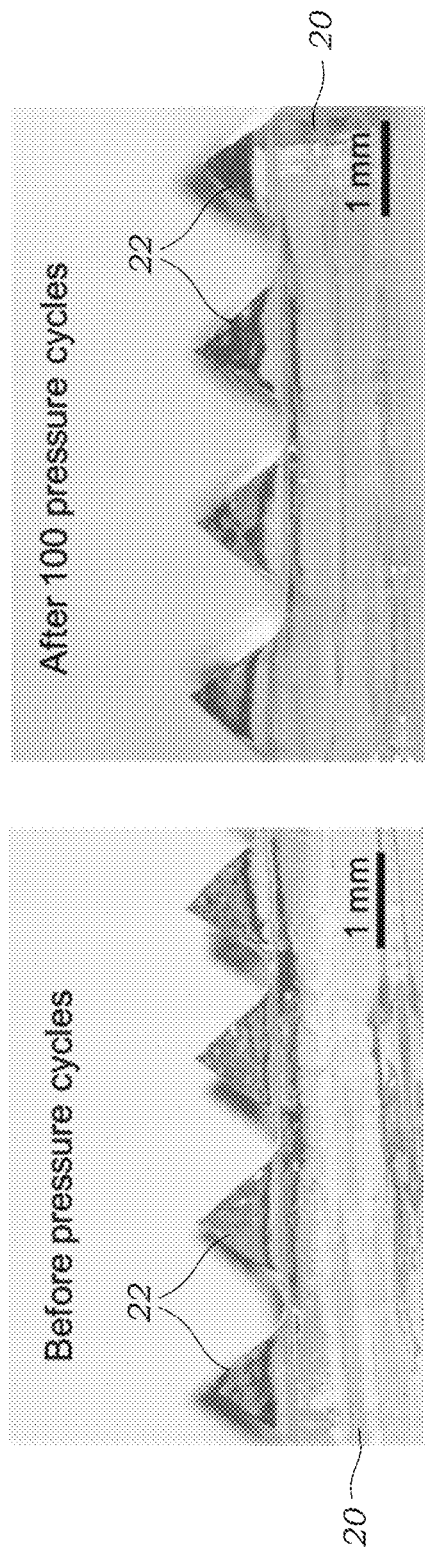
FIG. 9B
FIG. 9A

PRESSURE SENSOR DEVICE WITH ORGANIC ELECTROCHEMICAL TRANSISTORS WITH MICROSTRUCTURED HYDROGEL GATING MEDIUM

RELATED APPLICATION

This Application is a U.S. National Stage filing under 35 U.S.C. § 371 of International Application No. PCT/US2021/047612, filed on Aug. 25, 2021, which claims priority to U.S. Provisional Patent Application No. 63/074,335 filed on Sep. 3, 2020, which is are hereby incorporated by reference. Priority is claimed pursuant to 35 U.S.C. §§ 119, 371 and any other applicable statute.

STATEMENT REGARDING FEDERALLY SPONSORED RESEARCH AND DEVELOPMENT

This invention was made with government support under GM126571, awarded by the National Institutes of Health. The government has certain rights in the invention.

TECHNICAL FIELD

The technical field relates to wearable pressure sensors that can detect physiological signals in living subjects. More specifically, the technical field relates to subtle pressure sensors by using organic electrochemical transistors (OECTs) as an iontronic transducer.

BACKGROUND

Wearable biosensors have gained increased attention throughout the past decade due to their potential applications in personalized healthcare monitoring. Wearable pressure sensors are a branch of wearable biosensors, which act to monitor human motion and vital health signals, such as one's heartbeat or muscle actuation. To date, pressure sensors have been demonstrated based on various devices including resistors, capacitors, and transistors. Among these devices, organic transistor-based pressure sensors stand out due to their excellent biocompatibility, as well as the transistor's inherent signal-amplification ability, which increases the signal/noise ratio. As a result, organic field-effect transistors (OFETs) have been widely used for developing wearable pressure sensors. For example, Someya et al. reported the use of OFET arrays as pressure sensors to realize artificial skin. The mobility of the used OFETs was as high as 1.4 $cm^2/V \cdot s$. See S. Takao et al., A large-area, flexible pressure sensor matrix with organic field-effect transistors for artificial skin applications, PNAS, vol. 101, no. 27, pp. 9966-9970, July 2004. Bao and co-workers reported an OFET-based pressure sensor with microstructured polydimethylsiloxane (PDMS) dielectric layer which was able to detect human electrophysiological signals. See G. Schwartz et al., Flexible polymer transistors with high pressure sensitivity for application in electronic skin and health monitoring, Nat. Commun., vol. 4, pp. 1859-1867, May 2013. Most recently, Hu et al. reported the integration of an OFET with a piezoresistive resistor in which the former amplifies the detected signals from the latter. The resultant pressure sensor showed high sensitivity, low limit of detection, and fast response. See Z. Wang et al., The Semiconductor/Conductor Interface Piezoresistive Effect in an Organic Transistor for Highly Sensitive Pressure Sensors, Adv. Mater., vol. 31, no. 6, pp. 1805630-1805639, February 2019.

Despite the good performance of the aforementioned organic transistor-based pressure sensors, they mostly operate at high voltages between 10-100 V, with power-consumption between ~$10^2$-$10^3$ µW. For practical wearable sensing applications, a decrease in the operation voltage and power-consumption is desired for their long-term deployment on the human body.

Iontronic devices, which conduct both electrons and ions, recently emerged as advanced tools for applications at the biotic/abiotic interface. A typical iontronic device is organic electrochemical transistors (OECTs), which combine the merits of electrochemistry and transistors. Compared to OFETs, OECTs exhibit a much higher signal amplification due to their larger transconductance (~mS). As a result, in the past decade, OECTs have been heavily investigated for various iontronic biosensing applications. Some examples include recording and mimicking brain activity, electrochemical sensing of enzymatic reactions, and monitoring antibody-antigen binding dynamics for the selective detection of specific biomarkers.

Despite these merits of OECTs, their applications as pressure sensors have rarely been reported. This is because OECTs are often gated with an aqueous electrolyte, making it difficult to respond to external pressures.

SUMMARY

An OECT-based iontronic pressure sensor is disclosed where a microstructured ionic solid gel electrolyte is used as the gating medium. In one preferred embodiment, the microstructured ionic solid gel electrolyte is formed from a hydrogel that is used as a solid electrolyte. The pressure sensor is fabricated by introducing the solid-state ionic gel as a gating medium for the transistor. The ability to conduct both electrons and ions and the high transconductance of OECTs empower the resultant iontronic pressure sensor, a low operation voltage (<1 V), a low power-consumption (<1 mW), and high sensitivity. The OECT pressure sensor disclosed herein could replace current piezoelectric sensors for monitoring subtle pressures on the human body and for broad wearable and in-vivo biosensing applications. Fully biocompatible and biodegradable devices can be achieved on demand.

Upon applying an external pressure at the gate electrode of the sensor, the microstructured solid gel electrolyte deforms and changes the capacitance at the hydrogel/gate interface, ultimately changed the number of ions that delivered to the channel. In this way, an amplified pressure signal can be obtained by measuring the output current of the OECT. Using this approach, the pressure sensor was able to detect a subtle pressure of 20 Pa (FIG. 3D). Furthermore, because OECTs operate at much lower voltages (0-1 V) due to the high capacitive nature of the electrical double layer (EDL), the sensors operate with a low power-consumption of 10-100 ρW, making them competitive candidates for wearable biosensing applications.

In one embodiment, a pressure sensor includes a substrate containing source electrode, a drain electrode and a channel formed from a conductive polymer material. One such example is poly(3,4-ethylenedioxythiophene) doped with poly(styrene sulfonate) (PEDOT:PSS). Another example is poly(3-hexythiophene-2,5-diyl) (P3HT). A microstructured solid gel electrolyte having a plurality of microstructures formed thereon is disposed atop the channel. The sensor includes a gate electrode disposed on the microstructured solid gel electrolyte, thereby sandwiching the microstructured solid gel electrolyte between the channel and the gate electrode. The microstructured solid gel electrolyte may include a hydrogel such as, for example, gelatin methacryloyl (GelMA) hydrogel.

In another embodiment, a method of using the pressure sensor includes locating the pressure sensor on a surface; applying a gate-source voltage and a drain-source voltage to the pressure sensor; measuring the drain-source current; and correlating the measured drain-source current to an applied pressure on the pressure sensor. Alternatively, the gate-source current may be measured and the measured gate-source current correlated to an applied pressure on the pressure sensor. Empirical testing and/or calibration may be used to correlate measured current to applied pressure in the sensors. This may be stored in a calibration curve or look up table which can be used to output a qualitative pressure value for the pressure applied to the pressure sensor.

In another embodiment, a method of making a pressure sensor of includes the operations of providing a substrate and forming source and drain electrodes on the substrate. A channel made from an electrically conducting polymer is formed between the source and drain electrodes. A microstructured solid gel layer is formed and deposited atop the channel. A gate electrode is then formed on the microstructured solid gel layer. In some embodiments, a plurality of such pressure sensors may be located on a common substrate with a common gate electrode shared among the plurality of pressure sensors.

BRIEF DESCRIPTION OF THE DRAWINGS

FIG. 1A is a schematic diagram of the device structure of an OECT (with a fluid-based electrolyte).

FIG. 1B is a typical transfer curve of an OECT.

FIG. 1C illustrates the equivalent circuits in an OECT. $C_G$ refers to the capacitance of $EDL_1$ (electrolyte/gate), CoI refers to capacitance of $EDL_2$ (electrolyte/channel).

FIGS. 1D-1E illustrate a schematic diagram of the microstructured solid gel-gated OECT iontronic pressure sensor according to one embodiment. The deformation of the solid gel determines the number of ions delivered into the channel.

FIG. 1F illustrate the $V_g$ and $V_{sol}$ change after application of external pressure on the gate electrode of the pressure sensor of FIGS. 1D and 1E.

FIG. 4A shows the $I_{ds}$ responses to pressure at different $V_{gs}$.

FIG. 4B is a magnified view of $I_{ds}$ within 300 Pa pressure (dashed rectangle of FIG. 4A). FIG. 4C show the sensitivity (S) values calculated at different $V_{gs}$.

FIGS. 5A-5D illustrate the power-consumption and stability evaluation of the OECT iontronic pressure sensor. FIG. 5A shows the calculated power-consumption and output $I_{ds}$ at different $V_{gs}$ (p=250 Pa). FIG. 5B shows the power-consumption and operation voltage comparison of the OECT iontronic pressure sensor with other transistor-based pressure sensors (the numbers correspond to the Table 1). FIG. 5C shows the stability test ($I_{ds}$) of the pressure sensor for 100 cycles at the pressure of 200 Pa. FIG. 5D illustrates $\Delta I/I_0$ change within 100 pressure cycles (p=200 Pa).

FIG. 8 illustrates the pressure profiles with time during the cyclic stability test of OECT pressure sensor. The cyclic pressure was applied periodically by a computer-controlled Instron 5937 tensile tester.

FIGS. 9A and 9B illustrate microscopic images of GelMA hydrogel microstructures before (FIG. 9A) and after 100 pressure cycles (FIG. 9B). The comparison indicates a minor change in the microstructure after 100 pressure cycles.

DETAILED DESCRIPTION OF ILLUSTRATED EMBODIMENTS

Figure 11:
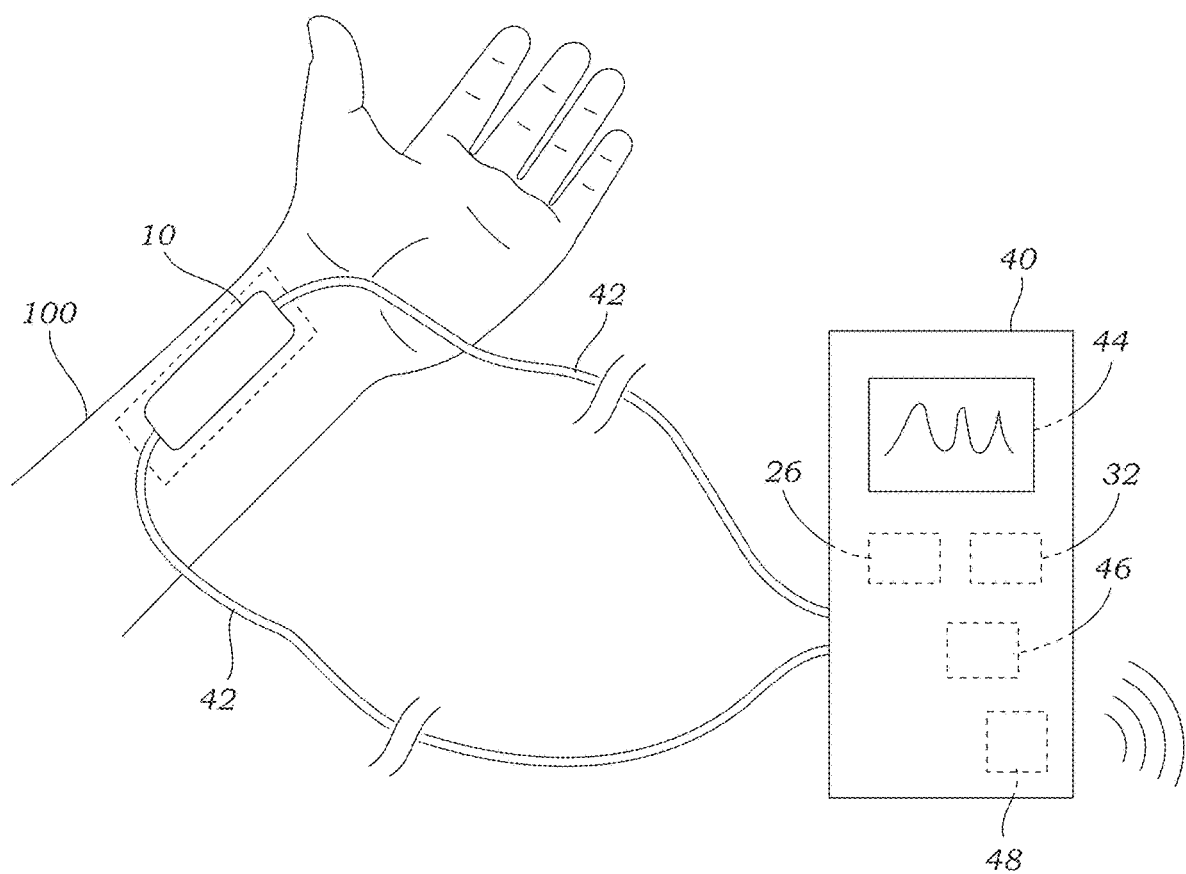
FIG. 11 illustrates an embodiment of the pressure sensor located on the wrist of a subject near the radial artery area. This pressure sensor may be used to measure, for example, pulse rate. Also illustrated is a measurement device that is connected to the pressure sensor.

With reference to FIGS. 1A, 1D, 1E, a pressure sensor 10 is disclosed that uses one or more organic electrochemical transistor elements 30 (OECTs) as an iontronic transducer. The pressure sensor 10 includes a substrate 12 which contains a source electrode 14, a drain electrode 16, and a channel 18 formed therebetween. The substrate 12 may include a variety of materials including rigid, flexible, or soft materials. In some embodiments, the substrate 12 may be optically transparent. The substrate 12 may, in some embodiments, be biodegradable. For example, the substrate may be located on glass, silicon, or rigid plastic. Flexible plastics or polymers may be used for flexible versions of the pressure sensor. Additional soft (and flexible materials) include elastomers may be used. For example, polyimide or polydimethylsiloxane (PDMS) may be used for the substrate 12 in some embodiments. In the experiments conducted herein, the substrate was polyethylene terephthalate (PET). For biosensing applications, a flexible and/or soft material is preferable as it may conform to the curved or irregular surface of tissue 100 such as illustrated in FIG. 11 (e.g., skin tissue 100). The source electrode 14 and drain electrode 16 are made from an electrically conductive metal or metal alloy (e.g., gold). As explained herein, in the specific implementation that was tested, the source electrode 14 and drain electrode 16 were formed from gold on a thin layer of titanium on PET for the substrate 12.

The channel 18 is formed between the source electrode 14 and the drain electrode 16 from an electrically conducting polymer. An example is poly(3,4-ethylenedioxythiophene) doped with poly(styrene sulfonate) (PEDOT:PSS). Another example includes poly(3-hexythiophene-2,5-diyl) (P3HT). A microstructured solid gel electrolyte 20 is disposed over the channel 18. The microstructured solid gel electrolyte 20 includes a solid gel electrolyte material having microstructures 22 formed thereon. The solid gel electrolyte 20 may include, in some embodiments, a hydrogel material. An exemplary hydrogel material includes gelatin methacryloyl (GelMA) hydrogel. While GelMA is disclosed as being used for the hydrogel for the microstructures 22 in preferred embodiments, it should be appreciated that other hydrogel materials may be used. These include by way of illustration and not limitation: polyacrylamide (PAAm), alginate/PAAm, poly(acrylic acid) (PAA), polyacrylate (PAC), polyvinyl alcohol (PVA), agarose, polyvinylidene fluoride or polyvinylidene difluoride (PVDF). The microstructures 22 are formed on a base and generally extend perpendicular to the base. Various shapes may be used for the microstructures 22 including pyramidal, microneedle, fins, grates, pillar or post microstructures. The microstructures 22 may be arranged as a repeating array or in a random configuration. The microstructures 22 have a height that is typically less than 750 μm. While microstructured solid gel electrolyte 20 (with microstructures 22) is preferred, in other embodiments, the solid gel electrolyte 20 may be a continuous layer (e.g., solid gel electrolyte layer) without any microstructures 22, although the performance of the pressure sensor 10 will suffer.

A gate electrode 24 is disposed on the microstructured solid gel electrolyte 20 (or solid gel electrolyte layer) and is made from an electrically conductive metal or metal alloy. In one embodiment, the gate electrode 24 is formed from a metal such as gold that is formed on a flexible substrate (e.g., PET, PDMS, polyimide) so that the entire pressure sensor 10 has a degree of flexibility and/or softness. Together, the source electrode 14, drain electrode 16, channel 18, gate electrode 24 and interposed microstructured solid gel electrolyte 20 form a transistor element 30 that is used to measure the pressure applied on the pressure sensor 10.

Figure 10:
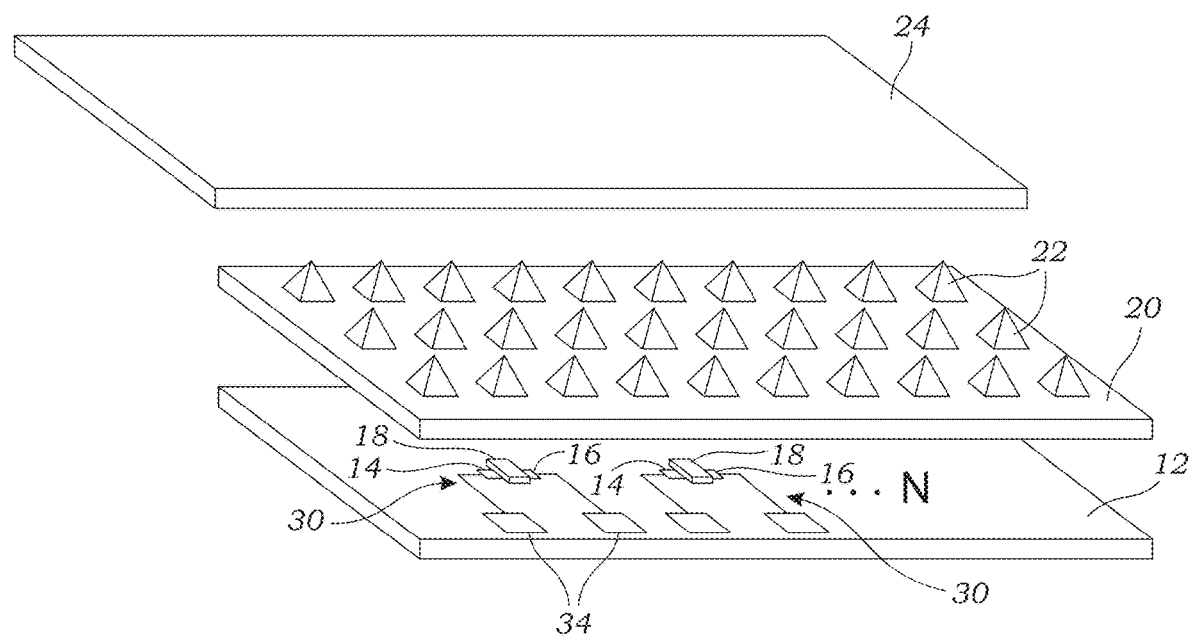
FIG. 10 illustrates another embodiment of a pressure sensor that has a plurality of pressure sensing transistor elements populated on the substrate. The pressure sensor shares a common gate electrode among all the pressure sending transistor elements although it is also possible that each transistor element is associated with its own gate electrode. This embodiment enables, for example, pressure mapping over a surface area or region.

In some embodiments, such as illustrated in FIG. 10, there may be multiple such pressure sensing transistor elements 30 formed on the substrate 12 that makes of the pressure sensor 10. Each transistor element 30 includes its own source electrode 14, drain electrode 16, and channel 18. The source electrode 14 and drain electrode are electrically coupled to contact pads 34 via electrically conductive traces, wires, layer or the like. A common layer of microstructured solid gel electrolyte 20 may be used across the plurality of transistor elements 30. In addition, a common gate electrode 24 may be used for the plurality of transistor elements 30. In this construction of a pressure sensor 10 with a plurality of transistor elements 30, different areas of the pressure sensor 10 (i.e., corresponding to the location of the transistor elements 30) may be used to separately measure pressure at different locations. This may enable pressure mapping across a plurality of locations. Alternatively, multiple measurements may be used to generate a median or average pressure reading using sensing areas on the pressure sensor 10.

In some embodiments, the channel 18 may be doped with a number of materials. These include conductivity enhancers such as glycerol, sorbitol, ethylene glycol (EG), and dimethyl sulfoxide (DMSO) and other kinds of high boiling point polar solvents. Dopants may also include stretchability enhancers such as dodecyl benzene sulfonic acid (DBSA), Capstone™ FS-30, and ionic liquids such as 1-Ethyl-3-methylimidazolium bis(trifluoromethylsulfonyl)imide (EMIM-TFSI) that have good solubility in water and the PEDOT:PSS matrix and have acidic anions. The dopant may also include crosslinkers such as 3-glycidyloxypropyl) trimethoxysilane (GOPS), divinylsulfone (DVS).

The pressure sensor 10 operates by applying a voltage between the drain electrode 16 and source electrode 14 (i.e., drain-source voltage) with a voltage source 26. A voltage is also applied between the gate electrode 24 and source electrode 14 with a voltage source 26. The voltage source 26 may include, for example, a source measure unit (SMU) or the like. The applied voltage may be direct current (DC), which was used in the experimental results described herein. Alternatively, the applied voltage may in other embodiments include alternating current (AC). The pressure sensor 10 measures pressure by measuring current flow through the transistor element(s) 30. In particular, pressure is determined based on the measured drain-source current or the gate-source current. Circuitry 28 is coupled to the pressure sensor 10 that allows for the measurement of the drain-source current or the gate-source current. This circuitry 28 may be included in or associated with the voltage source 26 (e.g., SMU). The circuitry 28 may also be separate from the voltage source 26. The pressure is then determined based on the measured current. A calibration curve or look-up table can then be used to output or generate a quantitative or qualitative pressure reading based on the measured current. For example, a transfer curve for the transistor element(s) 30 can be correlated to an applied pressure which can then be output. Empirical testing may be used to generate the calibration curve or look-up table for the particular pressure sensor 10. This may be stored, for example, within memory 46 (FIG. 11) or the like that can be accessed by a computing device, software, SMU, or microcontroller which can generate the final output (i.e., pressure reading) of the pressure sensor 10. The calibration curve or look-up table can then be accessed automatically by software or other computer-executable instructions to automatically output a qualitative and/or quantitative measure of the applied pressure.

The pressure sensor 10 may be used for bioelectronic sensing applications including wearable pressure sensors. This may include sensing small changes in pressure for biological and/or physiological data such as heartbeats, pulses, respiration, swallowing, and the like. The pressure sensor 10 may be secured to the tissue 100 of a mammalian subject and used to measure pressure changes such as illustrated in FIG. 11. With reference to FIG. 11, the pressure sensor 10 may be coupled to measurement device 40 that contains the voltage source 26 and circuitry 38 and is connected to the pressure sensor 10 via wires 42. The measurement device 40 may be a small, portable device that can be connected to the pressure sensor 10 to measurements. The measurement device 40 may include a power source therein (e.g., batteries) that is used to power the voltage source 26 and circuitry 38. The measurement device 40 may include a display 44 or screen which can be used to display measurements or readings from the pressure sensor 10. The measurement device 40 may also contain memory 46 therein which is used to store readings obtained from the pressure sensor 10 and/or calibration data (e.g., calibration curve or look-up table). In some embodiments, the measurement device 40 may include wireless functionality (e.g., WIFI, Bluetooth), using a wireless transmitter 48, which can transmit measurements readings wirelessly to a separate computing device or portable electronic device (e.g., mobile phone). In some embodiments, the measurement device 40 may be integrated with the pressure sensor 10 to form an integrated pressure sensor 10 without the need to be connected via wires 42.

To make or fabricate the pressure sensor 10, source electrode 14 and drain electrode 16 are formed on the substrate 12 using conventional lithographic techniques such as those described herein. The channel 18 of conducting polymer (e.g., poly(3,4-ethylenedioxythiophene) doped with poly(styrene sulfonate) (PEDOT:PSS)) is located between the source and drain electrodes 14, 16. The channel 18 may be deposited by spin-coating followed by curing or baking (as required). The microstructured solid gel electrolyte 20 is formed using a mold and removed therefrom and deposited atop the channel 18. A gate electrode 24 is formed on the microstructured solid gel electrolyte 20.

Experimental

The structure of a conventional OECT (with fluid electrolyte) is illustrated in FIG. 1A. In the pressure sensor 10 described herein (FIGS. 1D, 1E), conducting polymer poly (3,4-ethylenedioxythiophene) doped with poly(styrene sulfonate) (PEDOT:PSS) was employed as the channel material. Once a positive (negative) gate voltage ($V_{gs}$) is applied, the cations (anions) in the electrolyte are electrostatically repulsed into the conducting polymer, along with a dedoping process in the channel 18. The dedoping process decreases the conductivity of the PEDOT:PSS channel 18, while the doping process increases the conductivity (FIG. 1B). Therefore, in PEDOT:PSS OECTs, a small change in $V_{gs}$ leads to a larger change in source-drain current ($I_{ds}$) due to the amplification effect of the OECT. It is worth mentioning that OECTs exhibit superior transconductance ($\Delta I_{ds}/V_{gs}$) over other kinds of transistors due to their bulk doping ability (capacitance per volume).

At a fixed $V_{gs}$, partial of $V_{gs}$ is dropped on the gate-electrolyte interface ($V_g$) due to the presence of the $EDL_1$ and the rest is dropped on the channel ($V_{sol}$) due to the presence of $EDL_2$ (shown in FIG. 1C). The distribution of $V_g$ and $V_{sol}$ depends on the capacitance ratio of $EDL_1/EDL_2$ ($C_G/C_{CH}$). It was hypothesized that by employing a microstructured solid gel electrolyte 20 gating media, the $C_G/C_{CH}$ ratio should respond to external pressure on the gate due to the mechanical deformation. This is illustrated schematically in FIGS. 1D, 1E. In this way, at a fixed $V_{gs}$, the $V_{sol}$ (which determines the output $I_{ds}$ of the OECT) depends only on the pressure applied to the gate electrode 24 (FIG. 1F). The microstructured solid gel electrolyte 20 was employed at $EDL_1$ rather than $EDL_2$ to simplify fabrication by avoiding an additional alignment step with the PEDOT:PSS channel 18. Thus, the tips of pyramidal microstructures 22 were oriented toward the gate electrode 24.

Figures 2A, 2B, 2C:
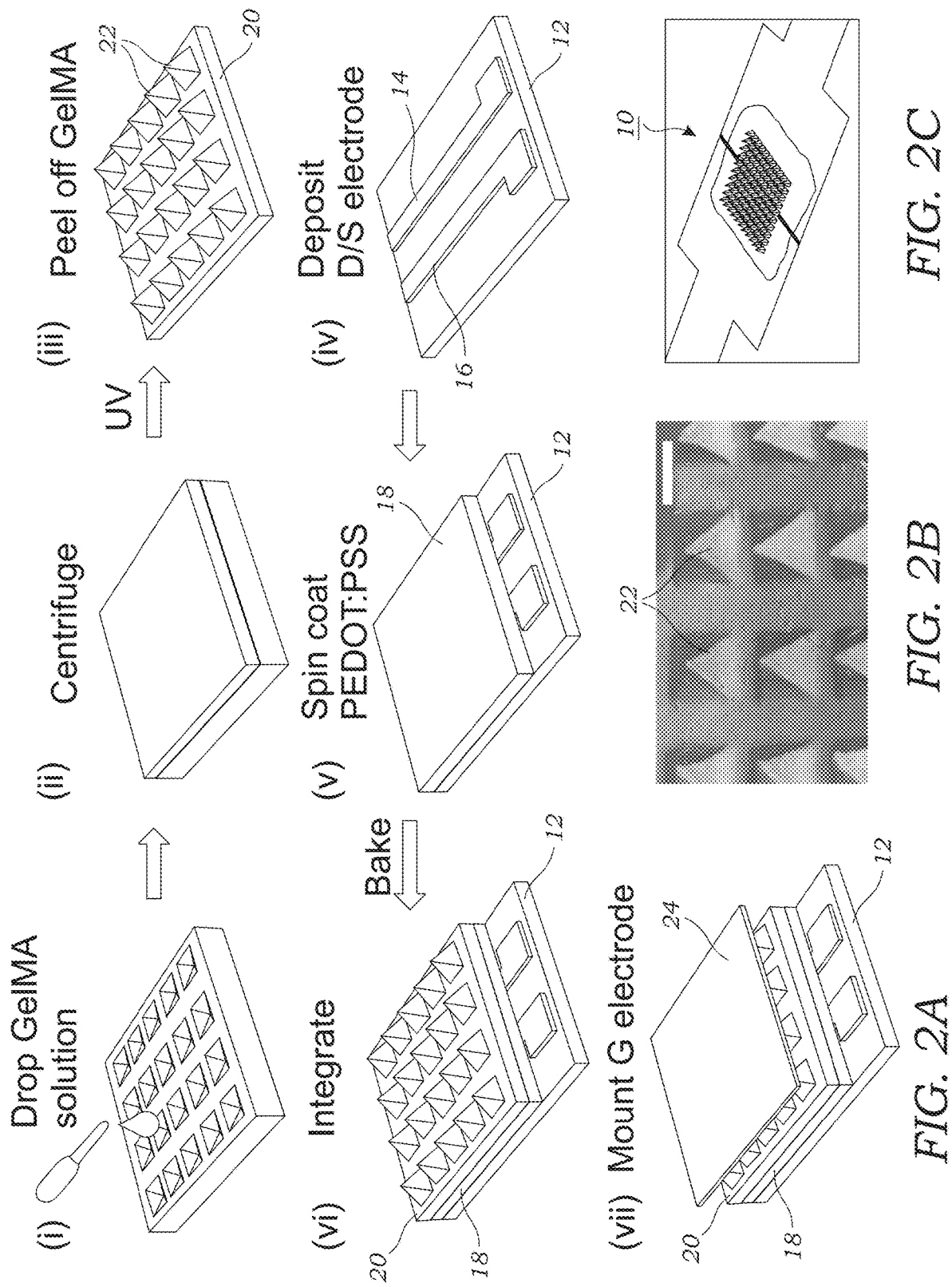
FIG. 2A is a schematic illustrating the fabrication process of the OECT-based pressure sensor.
FIG. 2B is a SEM image of the microstructured solid gel electrolyte in the form of a hydrogel with pyramidical microstructures on the surface, the scale bar is 1 mm.
FIG. 2C is a line drawing of the OECT iontronic pressure sensor, the scale bar is 10 mm.

The assembly of the OECT iontronic pressure sensor 10 started with the fabrication of the microstructured solid gel electrolyte 20 in the form of a hydrogel (FIG. 2A). A PDMS reverse mold was obtained by casting a 3D printed microneedle array. Next, precursors of gelatin methacryloyl (GelMA) hydrogel were cast on the surface of the PDMS mold, followed by a centrifuging process. In this way, crosslinked GelMA hydrogel could be obtained after 5 mins of UV exposure. The microstructured solid hydrogel 20 (with a water content of ~80%) could be easily peeled off from the hydrophobic PDMS due to its hydrophilic nature. The microstructured solid hydrogel 20 was then attached to the channel 18 of the OECT transistor element 30, with the microstructured surface facing up (FIG. 2A vi)). The assembly was completed after capping the gate electrode 24 (Au/PET) onto the microstructured GelMA hydrogel (FIG. 2A (vii)). The GelMA hydrogel with pyramidical microstructures 22 is shown in FIG. 2B and the assembled OECT pressure sensor 10 is shown in FIG. 2C.

Figure 3A:
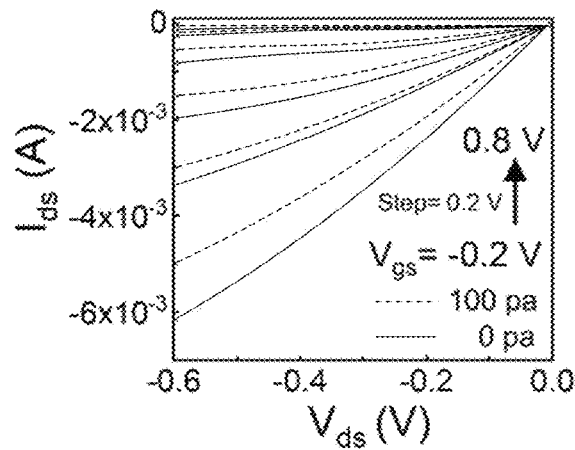
FIG. 3A illustrates the output curves of the OECT-based pressure sensor with and without the application of 100 Pa pressure.
Figure 3B:
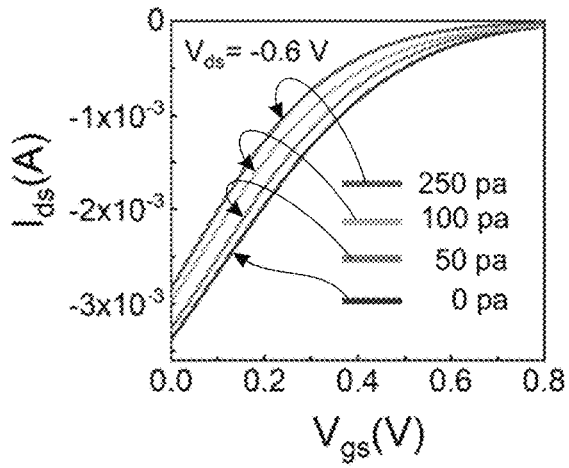
FIG. 3B shows the transfer curves of the OECT-based pressure sensor in the presence of 0, 50, 100, 250 Pa pressure.
Figure 3C:
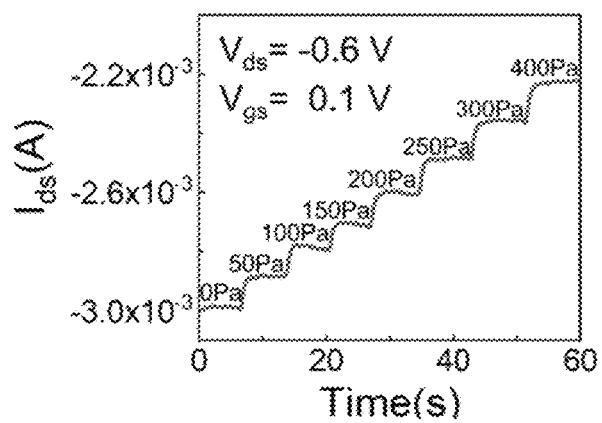
FIG. 3C shows the real-time monitoring of $I_{ds}$ change upon a step-wise increase in pressure.
Figure 3D:
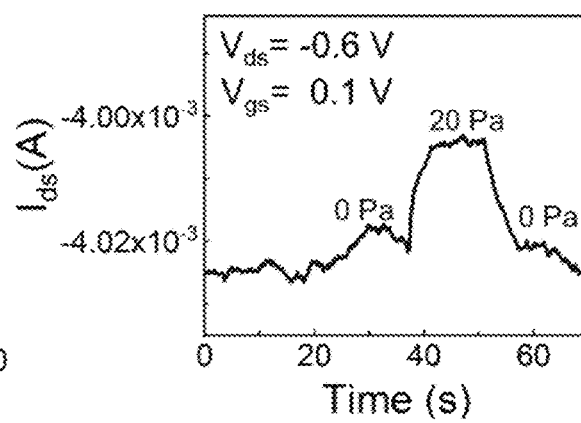
FIG. 3D shows the real-time $I_{ds}$ change in the presence of 20 Pa pressure.
Figure 7:
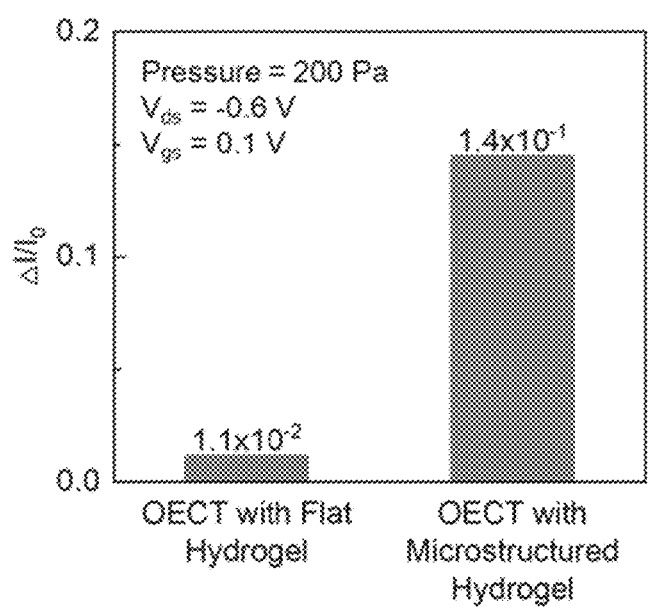
FIG. 7 illustrates the pressure response OECTs with flat hydrogel and microstructured hydrogel as gating medium. In the presence of pressure, the microstructured hydrogel-gated OECT showed 10 times higher change in $\Delta I/I_0$ compared to the flat hydrogel-gated OECT.

The electrical performance of the OECT iontronic pressure sensor 10 is shown in FIGS. 3A-3D. The hydrogel-gated OECT operated in a low voltage range between 0 V and 0.8 V. It showed typical transistor behavior working in the depletion mode and responded to external pressure (FIGS. 3A, 3B). An ON/OFF ratio of ~$10^2$ was recorded ($V_{gs}$ (−0.2 V)/$V_{gs}$ (0.8 V), source-drain voltage (Vas)=−0.6 V). A decrease in $I_{ds}$ was observed in both the output and transfer curves upon the application of an external pressure, while a negligible current change was observed in the reference device employing flat (no microstructures) GelMA hydrogel as the gating medium (FIG. 7). As shown in the output curves (FIG. 3A), upon applying an external pressure of 100 Pa, the $I_{ds}$ responded when $V_{gs}$ scanned from −0.2 V to 0.8 V. A stepwise decrease in $I_{ds}$ was observed in the transfer curves (FIG. 3B) when the pressure was varied from 0 to 250 Pa. The OECT pressure sensors 10 showed stable current responses to the external pressure and maintained a stable baseline under different pressure values, demonstrating its reliability (FIG. 3C). The pressure sensor 10 was able to detect a pressure as low as 20 Pa ($V_{gs}$=0.1 V, $V_{ds}$=−0.6 V, FIG. 3(d)). The above results validated the hypothesis and highlighted the key aspect of the pressure sensor 10: a microstructured hydrogel-gated solid-state OECT is capable of serving as an iontronic pressure sensor 10. The pressure applied on the gate electrode 24 determines the $C_G$ by changing the overlapping area (A) and distance (d) between the gate electrode 24 and hydrogel electrolyte ($C=\varepsilon_0\varepsilon_r A/d$, where $\varepsilon_0$ is the vacuum permittivity, $\varepsilon_r$ is the relative dielectric constant of the dielectric layer between two parallel plates). This process changed the $V_{sol}$ and finally influenced the output current ($I_{ds}$).

Figures 4A, 4B, 4C:
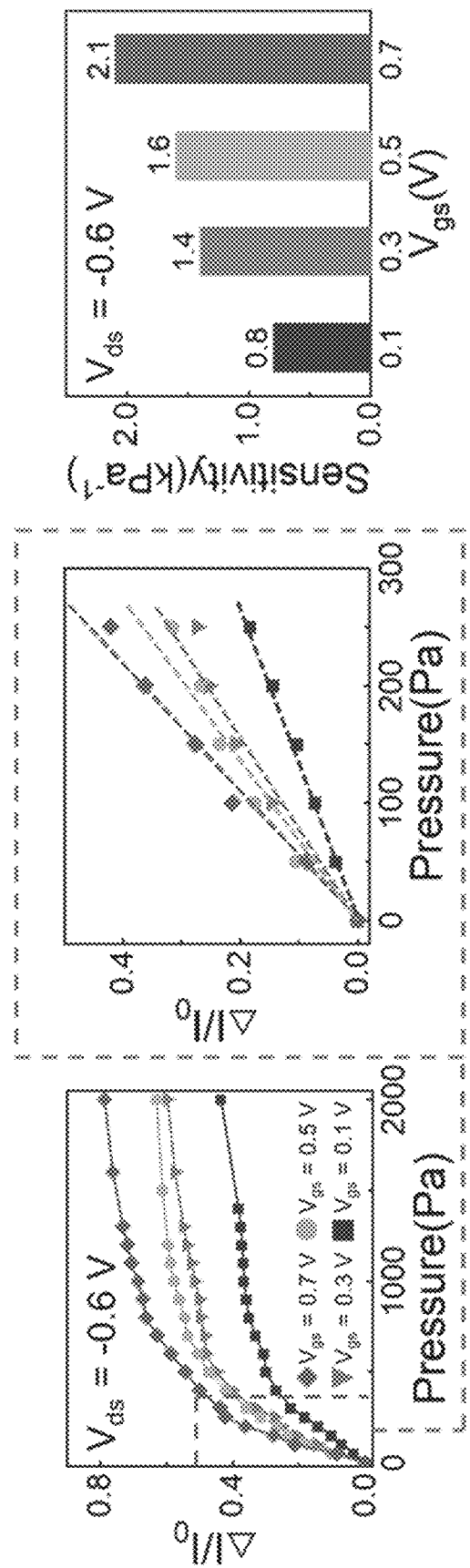
FIGS. 4A-4C shows the sensitivity characterization of the OECT iontronic pressure sensor under different pressures.

FIGS. 4A-4C shows the sensitivity of the OECT-based pressure iontronic sensor 10 under different pressures. The sensitivity (S) is defined as follows:

$$S = \frac{d((I - I_0)/I_0)}{dp} \quad (1)$$

where p is the applied pressure, I refers to the $I_{ds}$ in the presence of pressure, and $I_0$ refers to $I_{ds}$ in the absence of pressure. A highest sensitivity of 2.1 $kPa^{-1}$ was obtained between 0 and 250 Pa ($V_{gs}$=0.7 V, $V_{ds}$=−0.6 V). The sensitivity decreased at higher pressure values. For example, the $I_{ds}$ showed a linear change to external pressure within 300 Pa and reached a plateau at higher pressure values (FIG. 4A). The decrease in sensitivity at higher pressure is attributed to flattened microstructures 22 of the hydrogel caused by the overloaded pressure, which hinders its deformation ability at higher pressures. Nevertheless, these results demonstrate that the OECT iontronic pressure sensor 10 is capable of monitoring small body pressures less than 300 Pa, which well covers pressures generated by heartbeats, pulses, and respiration.

The sensitivity of the OECT iontronic pressure sensor 10 could be controlled by changing the $V_{gs}$. As shown in FIG. 4B, a distinguishable and steeper slope in $(I-I_0/I_0)$ (higher sensitivity S) was extracted when the $V_{gs}$ was increased from 0.1 V to 0.7 V (a step of 0.2 V), which corresponded to a sensitivity boost from 0.8 kPa$^{-1}$ to 2.1 kPa$^{-1}$ (FIG. 4C). The higher S obtained at larger $V_{gs}$ could be attributed to a decrease in the base current $I_0$. As indicated in Equation 1, at the same $\Delta I$ $(I-I_0)$, a decrease in $I_0$ leads to an increase in S. Besides, a decreased $I_0$ also means a lower background current which is essential for an improved signal/noise ratio.

The fact that the sensitivity can be controlled by $V_{gs}$ makes the OECT iontronic pressure sensor 10 advantageous over other conventional two-end based pressure sensors (resistive, capacitive, and piezoelectric), whose sensitivities are fixed once the device is assembled. This unique property enables its use in more broad application scenarios. For example, when detecting a subtle pressure such as pulse rate, a higher $V_{gs}$ could be applied to output the highest S. Whereas for applications requiring integration with other electronic systems, a lower $V_{gs}$ could be applied to increase the output $I_{ds}$ (thus a stronger anti-noise ability). In this regard, the PEDOT:PSS OECT iontronic pressure sensor 10 is unique because working in depletion mode makes it have an inherent high output $I_{ds}$ (mA), which is much higher than conventional field-effect transistors (FETs).

The OECT iontronic pressure sensor 10 operated at a low power-consumption of ~10 μW and a low operation voltage of <1 V, which are among the lowest values reported values for transistors-based pressure sensors (Table 1, FIG. 5B). Power-consumption (P) of a transistor-based pressure sensor is defined in the following formula:

$$P = V_{ds} \times I_{ds} + V_{gs} \times I_{gs} \quad (2)$$

TABLE 1

POWER-CONSUMPTION AND OPERATION VOLTAGE OF TYPICAL TRANSISTOR-BASED FLEXIBLE PRESSURE SENSORS

| Ref | Device/Gate medium | Operation Voltage(V) | Power-consumption(W) |
|---|---|---|---|
| 1 | OFET/PDMS | 100 | 1.0E*−3 |
| 2 | OFET/Polyimide | 20 | 2.0E*−5 |
| 3 | OFET/Fluoropolymer Cytop | 60 | 3.0E*−5 |
| 4 | OFET/PDMS | 80 | 4.0E*−4 |
| 5 | OFET/PDMS | 80 | 8.0E*−6 |
| 6 | OFET/Aluminum oxide and self-assembled monolayer | 3 | 1.5E*−3 |
| 7 | OFET/Polyimide | 40 | 4.0E*−5 |
| 8 | FET/Aluminum oxide | 5 | 3.0E*−4 |
| 9 | OFET/Poly(ethylene glycol) and polyacrylic acid | 0.7 | 7.0E*−9 |
| 10 | OFET/Hydrogel | 0.5 | 6.0E*−6 |
| Pressure Sensor 10 | OECT/Hydrogel | 0.7 | 2.1E*−5 |

References (Table 1)
1 Schwartz et al., Flexible polymer transistors with high pressure sensitivity for application in electronic skin and health monitoring, Nat. Commun., vol. 4, pp. 1859-1867, May 2013.
2 S. Takao, S. Tsuyoshi, I. Shingo, K. Yusaku, K. Hiroshi, and S. Takayasu, A large-area, flexible pressure sensor matrix with organic field-effect transistors for artificial skin applications, PNAS, vol. 101, no. 27, pp. 9966-9970, July 2004.
3 Z. Wang et al., The Semiconductor/Conductor Interface Piezoresistive Effect in an Organic Transistor for Highly Sensitive Pressure Sensors, Adv. Mater., vol. 31, no. 6, pp. 1805630-1805639, February 2019.
4 S. C. Mannsfeld et al., Highly sensitive flexible pressure sensors with microstructured rubber dielectric layers," Nat. Mater., vol. 9, no. 10, pp. 859-864, September 2010.

TABLE 1-continued

POWER-CONSUMPTION AND OPERATION VOLTAGE OF TYPICAL TRANSISTOR-BASED FLEXIBLE PRESSURE SENSORS

| Ref | Device/Gate medium | Operation Voltage(V) | Power-consumption(W) |
|---|---|---|---|

5 Y. Yeo, S. Park, Y. J. Yi, D. H. Kim, and J. A. Lim, "Highly Sensitive Flexible Pressure Sensors Based on Printed Organic Transistors with Centro-Apically Self-Organized Organic Semiconductor Microstructures, ACS Appl. Mater. Interfaces, vol. 9, no. 49, pp. 42996-43003, November 2017.
6 M. Kaltenbrunner et al., An ultra-lightweight design for imperceptible plastic electronics, Nature, vol. 499, no. 7459, pp. 458-464, July 2013.
7 S. Takao et al., Conformable, flexible, large-area networks of pressure and thermal sensors with organic transistor active matrixes, PNAS, vol. 102, no. 35, pp. 12321-12325, August 2005.
8 K. Takei et al., Nanowire active-matrix circuitry for low-voltage macroscale artificial skin, Nat. Mater., vol. 9, no. 10, pp. 821-826, October 2010.
9 Z. Liu, et al., Polyelectrolyte Dielectrics for Flexible Low-Voltage Organic Thin-Film Transistors in Highly Sensitive Pressure Sensing, Adv. Funct. Mater., vol. 29, no. 1, pp. 1806092-1806103, November 2019.
10 Q. Zhang et al., A Solid-State Aqueous Electrolyte-Gated Field-Effect Transistor as a Low-Voltage Operation Pressure-Sensitive Platform, Adv. Mater. Interfaces, vol. 1, pp. 1900719-1900727, July 2019.

The low power-consumption of the pressure sensor 10 stems from the low-voltage operation ability of the OECTs due to the ultrahigh capacitance of the $EDL_1$. For example, in the OECT iontronic pressure sensor 10, the applied $V_{ds}$ and $V_{gs}$ were both below 1 V. The output $I_{ds}$ was between μA ($V_{gs}$=0.7 V) to mA ($V_{gs}$=0 V) and the gate current (I g s) was negligible (μA to nA) regardless of the Vas. Therefore, a low power-consumption of ~10 μW was obtained ($V_{gs}$=0.7 V, $V_{ds}$=−0.6 V, FIG. 5A. In particular, a power-consumption of 2.1*10$^{-5}$ W was calculated when the device showed the highest sensitivity ($V_{gs}$=0.7 V, $V_{ds}$=−0.6 V). The low power-consumption, low operation voltage, together with high output current of the OECT pressure sensor 10, co-validates its promise towards durable and long-term wearable applications.

Finally, to gain insight into the stability of the OECT iontronic pressure sensor 10, a cyclic performance test was carried out. The performance of the pressure sensor 10 was measured under a cyclic pressure (applied with a computer-controlled tensile tester, FIG. 8) between 0 Pa and 200 Pa, the stable baseline was recorded with a minor change from 2.415 E$^{-3}$ to 2.413 E$^{-3}$ (FIG. 5C). The current response maintained a stable value within 100 cycles (FIG. 5D). In addition, FIGS. 9A, 9B indicates a mechanical reversibility of the microstructured GelMA after 100 cycles. However, a severe deterioration in performance stability was recorded after 100 cycles (~15 min), which could be attributed to water loss of the GelMA hydrogel material. This issue is expected to be mitigated by adding salt to the hydrogel and by encapsulating the pressure sensor 10 with water-impermeable elastomers or plastics.

An OECT-based iontronic pressure sensor 10 is disclosed for wearable biosensing applications. The pressure sensor 10 was developed with a microstructured solid gel (hydrogel) electrolyte 20 as the gating medium to increase the sensitivity of the OECT to external pressure. Compared to conventional pressure sensors, the OECT iontronic pressure sensor 10 has the following two distinct advantages: (1) the sensor operates at low voltages (0~1 V) with a low power-consumption (~10 μW); (2) the sensitivity and the output current are tunable by changing the $V_{gs}$. These unique properties encourage its use and integration in durable personalized wearable applications. Besides, considering OECTs have inherently higher transconductance (~mS) over other transistors, devices with higher sensitivity are expected to be obtained by scaling-down the device dimension. It is also envisioned that transparent, soft, and cost-effective OECT iontronic pressure sensors 10 can be further developed for wearable applications. This work extends the use of OECTs and paves the way for their deployment in personalized biosensing applications.

Materials

PEDOT:PSS (Clevios™ PH1000) was purchased from Heraeus Electronic Materials, Germany. Polydimethylsiloxane (PDMS, Sylgard 184 silicone elastomer kit) was purchased from Dow Corning, USA. Dulbecco's phosphate-buffered saline (DPBS) was purchased from Gibco, USA. Glycerol (99.0+% purity), (3-Glycidyloxypropyl)trimethoxysilane (GOPS), gelatin powder (gelatin from porcine skin), hexadecyltrimethylammonium bromide (or cetyltrimethylammonium bromide, CTAB), methacrylic anhydride and 2-hydroxy-4'-(2-hydroxyethoxy)-2-methylpropiophenone photoinitiator were purchased from Sigma-Aldrich, USA.

PDMS Mold Fabrication

A 3D printed micro-pyramidical mold was used for PDMS replication. The PDMS base and agent were mixed in a weight ratio of 5:1. The mixture was stirred for 10 min, and then placed in a desiccator for 30 min to remove bubbles. The PDMS mixture was then drop casted on the 3D printed mold and placed in a vacuum chamber for 30 min. Next, the sample was put in an oven for 1 h (80° C.). The PDMS mold could then be easily peeled-off from the mold.

Synthesis of GelMA 10 g gelatin was added to preheated 100 ml DPBS (50° C.). The blend was further mixed with a magnetic stirrer until gelatin was fully dissolved. Then 8 ml methacrylic anhydride (MA) was added and mixed for another 2 hours. Next, 100 ml DPBS (50° C.) was added to dilute the solution. The solution was then dialyzed in DI water using a dialysis tubing at 40° C. for one week. Solution was filtered with Whatman filter paper. The solution was then freeze-dried at 8.0-9.0 Pa for four days. The obtained GelMA macromer was stored in 4° C. fridge before use.

Fabrication of the Microstructured GelMA Hydrogel

Freeze-dried GelMA macromer was mixed with 0.01 M CTAB and 2-hydroxy-4'-(2-hydroxyethoxy)-2-methylpropiophenone (photoinitiator, 0.05% (w/v)) at 80° C. The prepared GelMA solution was dropped on the PDMS mold. The sample was then centrifuged for 10 min at 3,500 rpm (40° C.), and irradiated under UV light (620 mW) for 5 min. The microstructured solid GelMA hydrogel 20 was then peeled off and stored in 0.01 M CTAB before use.

Fabrication and Characterization of the OECT-Based Pressure Sensor

Figure 6:
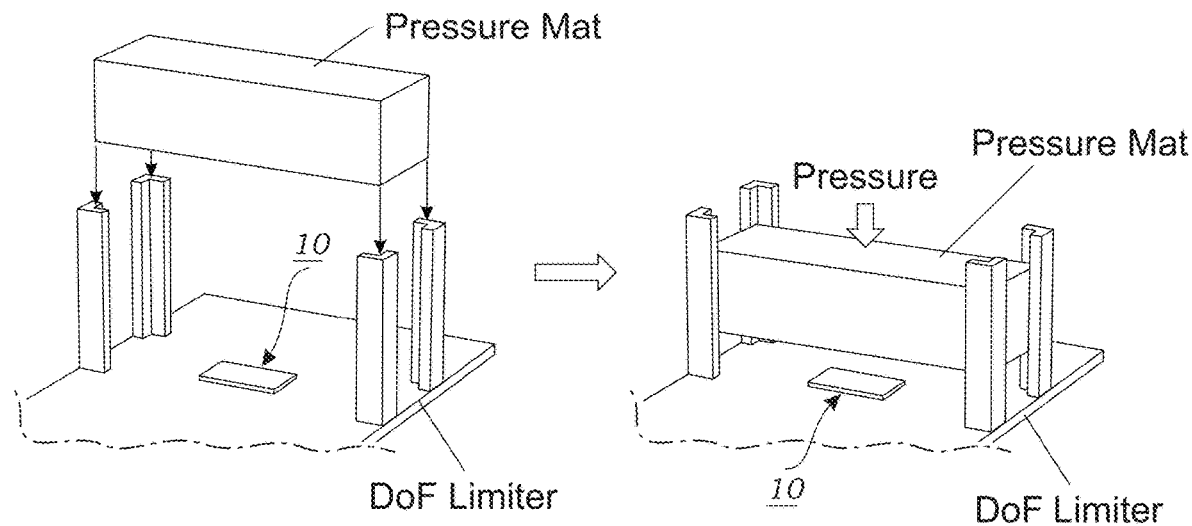
FIG. 6 illustrates a schematic of a 3D-printed test apparatus used for characterization of OECT iontronic pressure sensor.

The metallic source electrode 14, drain electrode 16 and gate electrode 24 (Ti/Au, 10/100 nm) were deposited by CHA solution Electron Beam Evaporator on PET and directly patterned by a shadow mask. The length and width of the channel 18 were 500 μm and 20 mm, respectively. The PEDOT:PSS mixture consisted of PEDOT:PSS, Glycerol, and GOPS in the volume ratio of 100:5:1. The PEDOT:PSS (spin-coated at 2000 rpm for 30 s) was patterned with Kapton tape. The film was baked at 100° C. for 30 min. Afterward, the microstructured solid GelMA hydrogel 20 was placed on the PEDOT:PSS channels 18 with the microfeatures 22 (e.g., microneedles) facing up. The electrical performance of the OECT pressure sensor was characterized using a Keysight B2902A, Instron 5943, and a 3D printed mold for alignment (FIG. 6) and application of pressure. The pressure sensor 10 was located on a DOF limiter and a pressure mat was applied on the pressure sensor 10 to measure the response.

While embodiments of the present invention have been shown and described, various modifications may be made without departing from the scope of the present invention. The invention, therefore, should not be limited, except to the following claims, and their equivalents.

What is claimed is:

1. A pressure sensor comprising:
   a substrate containing source electrode, a drain electrode and a channel formed from a material comprising an electrically conducting polymer;
   a microstructured hydrogel electrolyte comprising a plurality of microstructures formed thereon, the microstructured hydrogel electrolyte disposed atop the channel;
   a gate electrode disposed on the microstructured hydrogel electrolyte; and
   wherein the pressure sensor operates at a voltage less than about 1 V and a power consumption less than about 1 mW.

2. The pressure sensor of claim 1, wherein the electrically conducting polymer comprises poly(3,4-ethylenedioxythiophene) doped with poly(styrene sulfonate) (PEDOT:PSS).

3. The pressure sensor of claim 1, wherein the electrically conducting polymer comprises poly(3-hexythiophene-2,5-diyl) (P3HT).

4. The pressure sensor of claim 1, wherein the microstructured hydrogel electrolyte comprises gelatin methacryloyl (GelMA) hydrogel.

5. The pressure sensor of claim 4, wherein the microstructures comprise pyramidal microstructures, microneedle microstructures, or post or pillar microstructures.

6. The pressure sensor of claim 1, further comprising a voltage source coupled to the drain electrode and source electrode and configured to apply a drain-source voltage.

7. The pressure sensor of claim 1, further comprising a voltage source coupled to the gate electrode and source electrode and configured to apply a gate-source voltage.

8. The pressure sensor of claim 1, further comprising circuitry coupled to the drain electrode and source electrode and configured to measure drain-source current.

9. The pressure sensor of claim 1, further comprising circuitry coupled to the gate electrode and source electrode and configured to measure gate-source current.

10. The pressure sensor of claim 1, further comprising circuitry coupled to the drain electrode, source electrode, and gate electrode and configured to apply a DC gate-source voltage and/or a DC drain-source voltage.

11. The pressure sensor of claim 1, further comprising circuitry coupled to the drain electrode, source electrode, and gate electrode and configured to apply an AC gate-source voltage and/or an AC drain-source voltage.

12. The pressure sensor of claim 1, wherein the microstructured hydrogel electrolyte comprises polyacrylamide (PAAm), alginate/PAAm, poly(acrylic acid) (PAA), polyacrylate (PAC), polyvinyl alcohol (PVA), agarose, polyvinylidene fluoride or polyvinylidene difluoride (PVDF).

13. The pressure sensor of claim 1, wherein the electrically conducting polymer is further doped with one or more of a conductivity enhancer, ionic liquid, stretchability enhancer, and crosslinker.

14. The pressure sensor of claim 13, wherein the ionic liquid comprises bis(trifluoromethylsulfonyl)imide (EMIM-TFSI).

15. A pressure sensor comprising:
   a substrate containing a plurality of pressure sensing transistor elements, each transistor element comprising a source electrode, a drain electrode and a channel formed from a material comprising an electrically conducting polymer;

a microstructured hydrogel electrolyte comprising a plurality of microstructures formed thereon, the microstructured hydrogel electrolyte disposed atop the channel;

a gate electrode disposed on the microstructured hydrogel electrolyte; and wherein the pressure sensor operates at a voltage less than about 1 V and a power consumption less than about 1 mW.

16. The pressure sensor of claim 15, wherein the electrically conducting polymer comprises poly(3,4-ethylenedioxythiophene) doped with poly(styrene sulfonate) (PEDOT:PSS).

17. The pressure sensor of claim 15, wherein the electrically conducting polymer comprises poly(3-hexythiophene-2,5-diyl) (P3HT).

18. The pressure sensor of claim 15, wherein the microstructured hydrogel electrolyte comprises gelatin methacryloyl (GelMA) hydrogel.

19. A method of using the pressure sensor of claim 1 comprising:

locating the pressure sensor on a surface; and applying a gate-source voltage and a drain-source voltage to the pressure sensor;

measuring the drain-source current or the gate-source current; and correlating the measured drain-source current or gate-source current to an applied pressure on the pressure sensor.

* * * * *